United States Patent
Cho et al.

(10) Patent No.: US 10,930,648 B2
(45) Date of Patent: Feb. 23, 2021

(54) SEMICONDUCTOR DEVICES HAVING MULTI-LEVEL METALLIZATION STRUCTURES

(71) Applicant: Samsung Electronics Co., Ltd., Suwon-si (KR)

(72) Inventors: Moon Gi Cho, Anyang-si (KR); Hyeonuk Kim, Seoul (KR); Jongchan Shin, Seongnam-si (KR); Eryung Hwang, Yongin-si (KR); Jaeseok Yang, Hwaseong-si (KR); Jinwoo Jeong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/422,199

(22) Filed: May 24, 2019

(65) Prior Publication Data
US 2019/0287965 A1    Sep. 19, 2019

Related U.S. Application Data

(63) Continuation of application No. 15/926,572, filed on Mar. 20, 2018, now Pat. No. 10,347,627.

(30) Foreign Application Priority Data

Jun. 14, 2017    (KR) .................. 10-2017-0075059

(51) Int. Cl.
*H01L 27/08* (2006.01)
*H01L 27/02* (2006.01)
(Continued)

(52) U.S. Cl.
CPC .......... *H01L 27/088* (2013.01); *H01L 23/528* (2013.01); *H01L 27/0207* (2013.01); *H01L 27/0886* (2013.01); *H01L 27/11807* (2013.01); *H01L 29/0646* (2013.01); *H01L 29/785* (2013.01); *H01L 21/823475* (2013.01); *H01L 21/823481* (2013.01); *H01L 23/5226* (2013.01); *H01L 23/53233* (2013.01); *H01L 23/53295* (2013.01); *H01L 27/092* (2013.01); *H01L 27/0924* (2013.01); *H01L 27/11504* (2013.01);
(Continued)

(58) Field of Classification Search
CPC .............. H01L 27/088; H01L 27/0207; H01L 27/0886; H01L 27/11807; H01L 23/528; H01L 29/0646; H01L 29/785
See application file for complete search history.

(56) References Cited

U.S. PATENT DOCUMENTS

| 6,800,888 B2 | 10/2004 | Watanabe et al. |
| 6,867,451 B2 | 3/2005 | Hieda et al. |

(Continued)

FOREIGN PATENT DOCUMENTS

| KR | 10-2015-0081230 | 7/2015 |
| KR | 10-1679684 | 11/2016 |

*Primary Examiner* — Ida M Soward
(74) *Attorney, Agent, or Firm* — Myers Bigel, P.A.

(57) ABSTRACT

Semiconductor devices are provided. A semiconductor device includes a gate structure and an adjacent contact. The semiconductor device includes a connector that is connected to the contact. In some embodiments, the semiconductor device includes a wiring pattern that is connected to the connector. Moreover, in some embodiments, the connector is adjacent a boundary between first and second cells of the semiconductor device.

20 Claims, 17 Drawing Sheets

(51) Int. Cl.
- *H01L 27/11* (2006.01)
- *H01L 23/52* (2006.01)
- *H01L 29/06* (2006.01)
- *H01L 29/78* (2006.01)
- *H01L 27/088* (2006.01)
- *H01L 23/528* (2006.01)
- *H01L 27/118* (2006.01)
- *H01L 27/11565* (2017.01)
- *H01L 27/11587* (2017.01)
- *H01L 27/11519* (2017.01)
- *H01L 27/11504* (2017.01)
- *H01L 21/8234* (2006.01)
- *H01L 23/522* (2006.01)
- *H01L 23/532* (2006.01)
- *H01L 27/092* (2006.01)
- *H01L 29/417* (2006.01)

(52) U.S. Cl.
CPC ... *H01L 27/11519* (2013.01); *H01L 27/11565* (2013.01); *H01L 27/11587* (2013.01); *H01L 29/41791* (2013.01); *H01L 2027/11829* (2013.01); *H01L 2027/11875* (2013.01)

(56) References Cited

U.S. PATENT DOCUMENTS

| | | | |
|---|---|---|---|
| 7,052,983 B2 * | 5/2006 | Park | H01L 21/76831 |
| | | | 257/E21.507 |
| 7,172,963 B2 * | 2/2007 | Yamada | B24B 37/04 |
| | | | 257/E21.304 |
| 8,012,871 B2 * | 9/2011 | Ohmori | H01L 21/02126 |
| | | | 438/624 |
| 8,431,464 B2 * | 4/2013 | Kobayashi | H01L 21/02216 |
| | | | 438/424 |
| 8,598,045 B2 * | 12/2013 | Kikuchi | H01L 21/76825 |
| | | | 438/740 |
| 8,872,267 B2 | 10/2014 | Iwamatsu et al. | |
| 8,879,305 B2 | 11/2014 | Liaw | |
| 9,041,115 B2 | 5/2015 | Liaw | |
| 9,257,429 B2 | 2/2016 | Moroz et al. | |
| 9,425,252 B1 | 8/2016 | Zang et al. | |
| 9,431,396 B2 | 8/2016 | Zang et al. | |
| 9,443,851 B2 | 9/2016 | Sengupta et al. | |
| 9,461,148 B2 * | 10/2016 | Park | H01L 29/66795 |
| 9,496,179 B2 | 11/2016 | Do et al. | |
| 9,536,991 B1 | 1/2017 | Zang et al. | |
| 9,543,298 B1 | 1/2017 | Zang et al. | |
| 9,553,028 B2 | 1/2017 | Xie et al. | |
| 9,589,845 B1 | 3/2017 | Jagannathan et al. | |
| 10,043,873 B2 * | 8/2018 | Yeo | H01L 29/408 |
| 10,205,020 B2 * | 2/2019 | Lee | H01L 29/7848 |
| 10,347,742 B2 * | 7/2019 | Smith | H01L 21/28123 |
| 2002/0100984 A1 * | 8/2002 | Oshima | H01L 21/76835 |
| | | | 257/774 |
| 2005/0121788 A1 * | 6/2005 | Watanabe | H01L 21/76801 |
| | | | 257/751 |
| 2011/0248317 A1 | 10/2011 | Kim et al. | |
| 2012/0325920 A1 * | 12/2012 | Ozaki | H01L 21/02063 |
| | | | 237/67 |
| 2014/0299993 A1 * | 10/2014 | Watanabe | H01L 23/522 |
| | | | 257/761 |
| 2015/0104889 A1 * | 4/2015 | Kato | H01L 21/76843 |
| | | | 438/16 |
| 2016/0336183 A1 | 11/2016 | Yuan et al. | |
| 2017/0004998 A1 * | 1/2017 | Pethe | H01L 21/28008 |
| 2017/0033101 A1 * | 2/2017 | Sharma | H01L 27/0924 |
| 2017/0294347 A1 * | 10/2017 | Chi | H01L 29/41766 |
| 2018/0047634 A1 | 2/2018 | Jun et al. | |

* cited by examiner

SEMICONDUCTOR DEVICES HAVING MULTI-LEVEL METALLIZATION STRUCTURES

CROSS-REFERENCE TO RELATED APPLICATIONS

This application is a continuation application of and claims priority from U.S. patent application Ser. No. 15/926,572, filed on Mar. 20, 2018, which claims priority under 35 U.S.C. § 119 to Korean Patent Application No. 10-2017-0075059, filed on Jun. 14, 2017, in the Korean Intellectual Property Office, the entire contents of which are hereby incorporated by reference herein.

BACKGROUND

The present disclosure relates to semiconductor devices and, more particularly, to semiconductor devices including a field effect transistor. A semiconductor device may include an integrated circuit having metal oxide semiconductor field effect transistors (MOSFETs). As the semiconductor device becomes highly integrated, MOSFETs may be scaled-down in size, which may result in deterioration of operating characteristics of the semiconductor device. For example, a process margin (e.g., spacing) of metal lines in the semiconductor device may decrease, which may result in deterioration of operating characteristics. Accordingly, various research has been developed to manufacture semiconductor devices having high performance while overcoming limitations due to the high integration of semiconductor devices.

SUMMARY

Some embodiments of the inventive concepts provide a semiconductor device including highly-integrated field effect transistors. Other objects of the present inventive concepts that have not been mentioned above, however, will be clearly understood by those skilled in the art from the following description.

According to example embodiments of the inventive concepts, a semiconductor device may include a plurality of active patterns extending in a first direction. The semiconductor device may include a plurality of gate structures crossing the active patterns and extending in a second direction crossing the first direction. The semiconductor device may include a device isolation layer extending in the second direction between adjacent first and second ones of the plurality of gate structures. The semiconductor device may include a plurality of contact patterns between the plurality of gate structures and the device isolation layer. The semiconductor device may include a plurality of connection patterns connected to the plurality of contact patterns, respectively. The device isolation layer may be between the plurality of connection patterns, and the plurality of connection patterns may be spaced apart from each other by a first distance in the first direction. The semiconductor device may include a plurality of wiring patterns connected to the plurality of connection patterns, respectively. Moreover, the device isolation layer may be between the plurality of wiring patterns, and the plurality of wiring patterns may be spaced apart from each other in the first direction by a second distance that is longer than the first distance.

A semiconductor device, according to some embodiments, may include a plurality of active patterns extending in a first direction. The semiconductor device may include a device isolation layer crossing the plurality of active patterns and extending in a second direction crossing the first direction. The semiconductor device may include a gate structure spaced apart from the device isolation layer and extending in the second direction to cross the plurality of active patterns. The semiconductor device may include a plurality of source/drain impurity layers on the plurality of active patterns on opposite sides of the gate structure. The semiconductor device may include a contact pattern connected to one of the plurality of source/drain impurity layers that is between the device isolation layer and the gate structure. The semiconductor device may include a connection pattern connected to the contact pattern and spaced apart by a first distance in the first direction from an axis that is aligned with the device isolation layer. Moreover, the semiconductor device may include a wiring pattern connected to the connection pattern and spaced apart in the first direction from the axis that is aligned with the device isolation layer by a second distance that is longer than the first distance.

A semiconductor device, according to some embodiments, may include a substrate including a first cell region that includes a first N-well region and a first P-well region and a second cell region that includes a second N-well region and a second P-well region. The semiconductor device may include a gate structure on the first cell region of the substrate. The semiconductor device may include first and second source/drain impurity regions on the substrate adjacent opposite first and second sides, respectively, of the gate structure. The semiconductor device may include a third source/drain impurity region on the second cell region of the substrate. The semiconductor device may include a first contact connected to the first source/drain impurity region and including a first metallic material. The semiconductor device may include a first connector that contacts the first contact and extends to overlap at least a portion of the gate structure. The first connector may include a second metallic material different from the first metallic material. The semiconductor device may include a second contact connected to the third source/drain impurity region. Moreover, the semiconductor device may include a second connector that contacts the second contact.

Details of other example embodiments are included in the description and drawings.

DETAILED DESCRIPTION

Hereinafter, a semiconductor device according to example embodiments of the inventive concepts will be described in detail in conjunction with the accompanying drawings.

Figure 1:
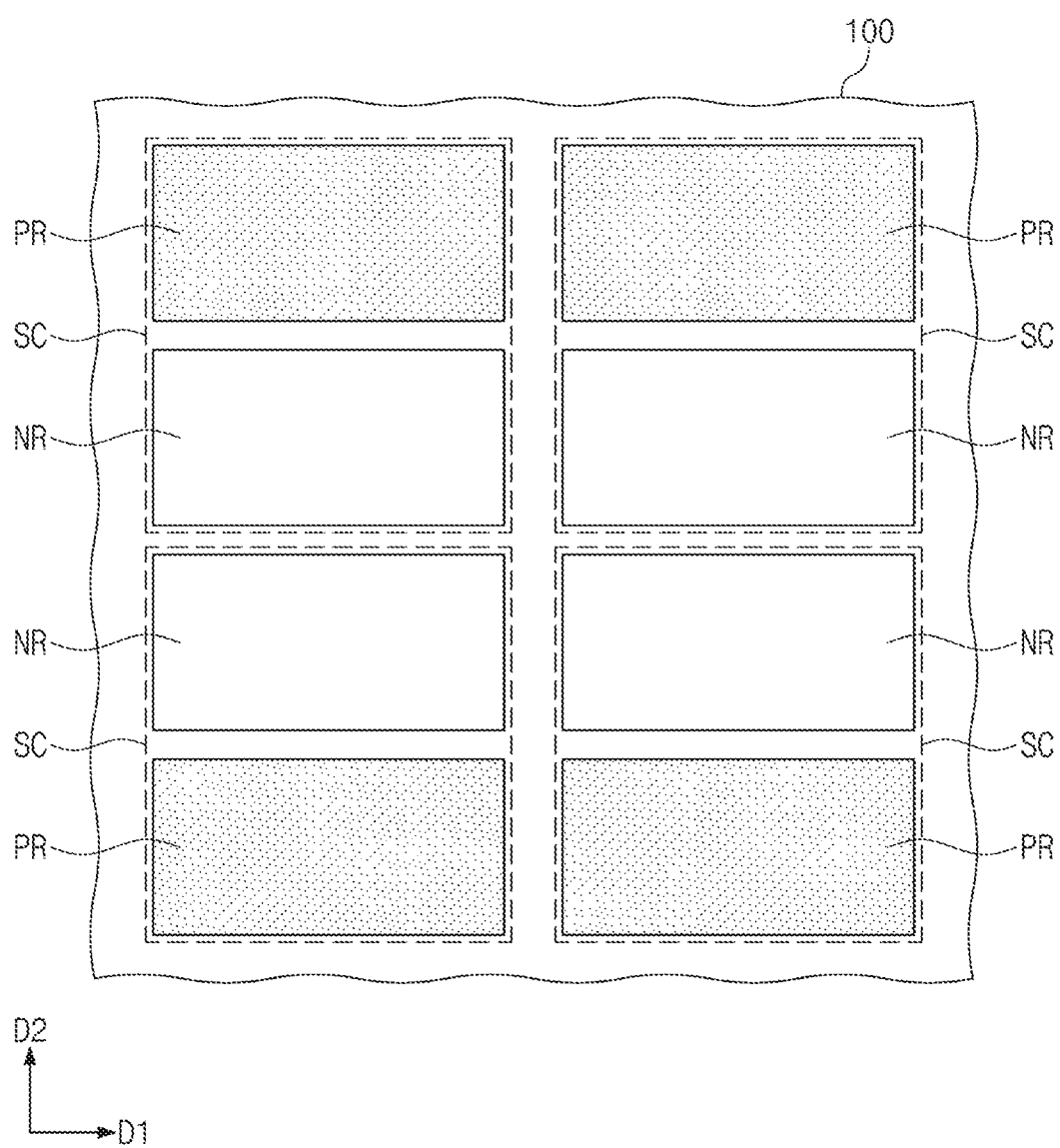
FIG. 1 illustrates a simplified plan view showing a semiconductor device according to example embodiments of the inventive concepts.

FIG. 1 illustrates a simplified plan view showing a semiconductor device according to example embodiments of the inventive concepts.

Referring to FIG. 1, a semiconductor substrate 100 may be provided thereon with a plurality of integrated standard cells SC including logic devices such as a logical sum gate or a logical product gate. For example, the standard cells SC may include a basic cell (e.g., an AND gate, an OR gate, a NOR, or an inverter), a complex cell (e.g., OAI (OR/AND/Inverter) gates and AOI (AND/OR/Inverter) gates), or a storage element (e.g., a master-slave flip-flop and a latch).

The standard cells SC may be two-dimensionally arranged along a first direction D1 and a second direction D2 crossing the first direction D1. Each of the standard cells SC may include a P-well region PR where NMOS field effect transistors are formed and an N-well region NR where PMOS field effect transistors are formed.

Figure 2:
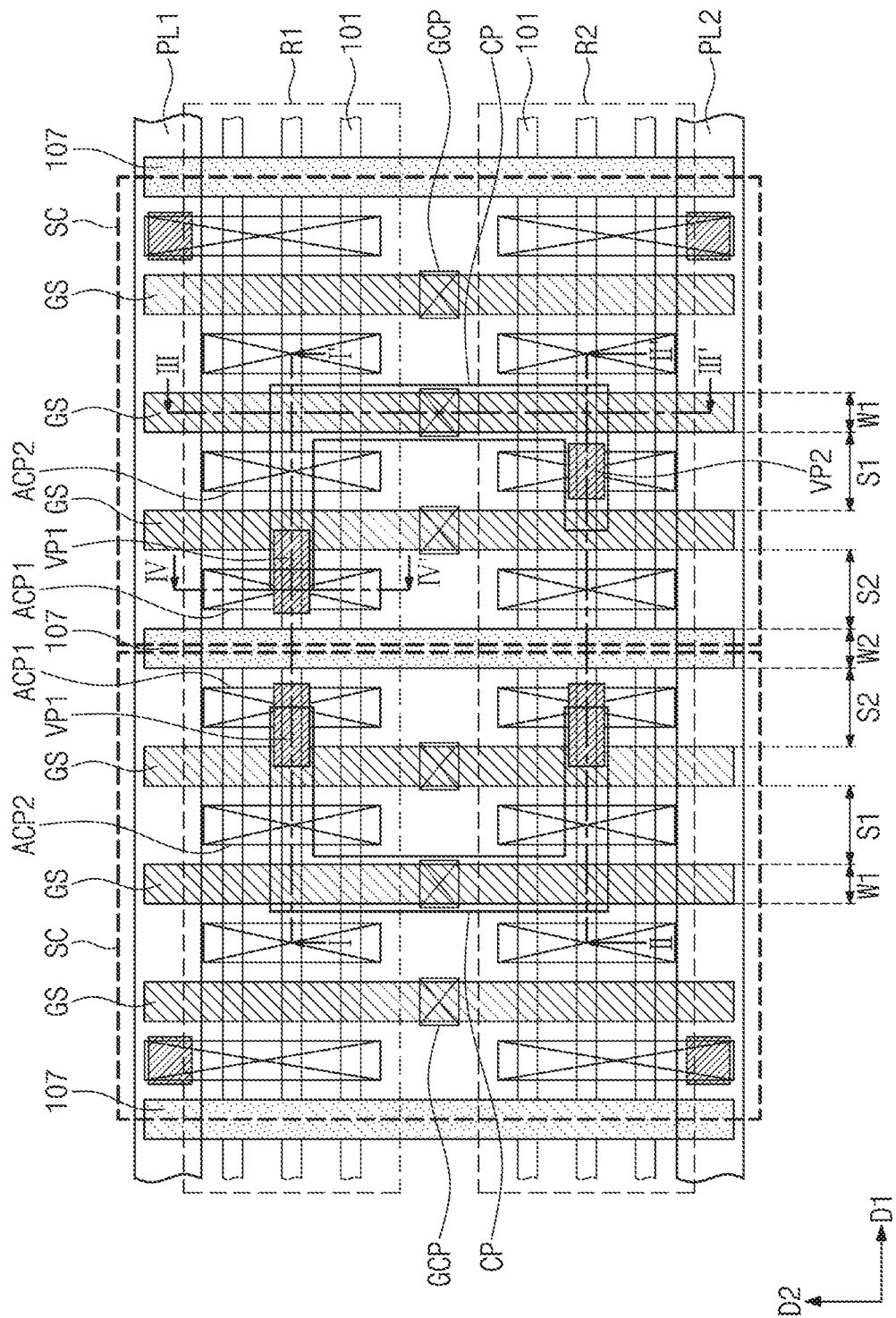
FIG. 2 illustrates a plan view showing a semiconductor device according to example embodiments of the inventive concepts.

FIG. 2 illustrates a plan view showing a semiconductor device according to example embodiments of the inventive concepts. FIGS. 3A, 3B, 3C, and 3D illustrate cross-sectional views respectively taken along lines I-I', II-II', III-III', and IV-IV' of FIG. 2.

Referring to FIGS. 2 and 3A to 3D, a semiconductor substrate 100 may be provided thereon with a plurality of standard cells SC arranged along a first direction D1. Each of the standard cells SC may include active patterns 101, gate structures GS, source/drain impurity layers 130, active contact patterns ACP1 and ACP2, gate contact patterns GCP, via patterns VP1 and VP2, wiring patterns CP, and power lines PL1 and PL2. The term "contact pattern" or the term "contact," as used herein, may refer to one of the active contact patterns ACP1 or ACP2. Moreover, as used herein, the term "connection pattern" or the term "connector" may refer to a via pattern VP, a via pattern VP1, or a via pattern VP2.

The semiconductor substrate 100 may include first and second well regions R1 and R2. In some embodiments, NMOS field effect transistors may be provided on the first well region R1, and PMOS field effect transistors may be provided on the second well region R2.

The semiconductor substrate 100 may be, for example, a silicon substrate, a germanium substrate, an SOI (Silicon On Insulator) substrate, or a GOI (Germanium On Insulator) substrate. At/in each of the first and second well regions R1 and R2, a plurality of the active patterns 101 may extend in the first direction D1, and may be spaced apart from each other in a second direction D2 crossing the first direction D1. The active patterns 101 may be portions of the semiconductor substrate 100 and may be defined by trenches formed in the semiconductor substrate 100.

A first device isolation layer 103 may be disposed between the active patterns 101, and upper portions of the active patterns 101 may be exposed by the first device isolation layer 103. For example, the first device isolation layer 103 may have a top surface below those of the active patterns 101, and the active patterns 101 may protrude upward beyond the top surface of the first device isolation layer 103. The first device isolation layer 103 may separate the active patterns 101 from each other in the second direction D2.

A second device isolation layer 105 may extend in the first direction D1 and may define the first well region R1 and the second well region R2. The second device isolation layer 105 may be provided between the active patterns 101 of the first well region R1 and the active patterns 101 of the second well region R2. The second device isolation layer 105 may have a width greater than that of the first device isolation layer 103. The second device isolation layer 105 may have a bottom surface at a level lower than or substantially the same as that of a bottom surface of the first device isolation layer 103. The second device isolation layer 105 may separate the first and second well regions R1 and R2 from each other in the second direction D2. The first and second device isolation layers 103 and 105 may be formed by forming trenches defining the active patterns 101 and filling portions of the trenches with an insulating material (e.g., a silicon oxide layer or a silicon nitride layer).

The gate structures GS may extend in the second direction D2, while crossing the active patterns 101 of the first and second well regions R1 and R2. The gate structures GS may be regularly arranged at a first pitch at/in each of the standard cells SC. For example, the gate structures GS may have substantially the same first width W1, and may be equally spaced apart from each other in the first direction D1 at a first spacing S1.

Each of the gate structures GS may include a gate dielectric layer 111, a gate barrier metal pattern 113, a gate metal pattern 115, and a capping insulation pattern 117. Gate spacers 121 may be disposed on opposite sidewalls of each of the gate structures GS.

The gate dielectric layer 111 may extend along the second direction D2, and may conformally cover upper portions of the active patterns 101. The gate dielectric layer 111 may extend from between the gate barrier metal pattern 113 and the active patterns 101 to between the gate barrier metal pattern 113 and the gate spacers 121. For example, the gate dielectric layer 111 may extend from a bottom surface of the gate metal pattern 115 to opposite sidewalls of the gate metal pattern 115. The gate dielectric layer 111 may include a high-k dielectric material whose dielectric constant is greater than that of silicon oxide. The gate dielectric layer 111 may include, for example, metal oxide, metal silicate, or metal silicate nitride.

The gate barrier metal pattern 113 may be disposed between the gate dielectric layer 111 and the gate metal pattern 115, and may extend between the gate metal pattern 115 and the gate spacers 121. The gate barrier metal pattern 113 may include conductive metal nitride (e.g., titanium nitride, tantalum nitride, and/or tungsten nitride). The gate metal pattern 115 may include a metallic material (e.g., tungsten, titanium, and/or tantalum). The capping insulation pattern 117 may cover a top surface of the gate metal pattern 115. The capping insulation pattern 117 may also cover top surfaces of the gate spacers 121. The capping insulation patterns 117 may have top surfaces substantially coplanar with that of a gap-fill insulation layer 131. The capping insulation patterns 117 and the gate spacers 121 may include, for example, silicon oxide, silicon nitride, silicon oxynitride, silicon carbon nitride (SiCN), or silicon carbon oxynitride (SiCON).

According to some embodiments, a third device isolation layer 107 may extend parallel to the gate structures GS in the second direction D2, and may be disposed between ones of (e.g., a pair of) the standard cells SC that are adjacent to each other. The third device isolation layer 107 may cross the active patterns 101 in the second direction D2, and may separate the active patterns 101 from each other in the first direction D1. The third device isolation layer 107 may separate field effect transistors that are adjacent to each other in the first direction D1. The third device isolation layer 107 may include, for example, a silicon oxide layer, a silicon nitride layer, a silicon oxynitride layer, a silicon carbon nitride (SiCN) layer, a silicon carbon oxynitride (SiCON) layer, or a combination thereof. For example, the third device isolation layer 107 may include a silicon nitride and/or a silicon oxide layer.

The third device isolation layer 107 may be disposed between ones of (e.g., a pair of) the gate structures GS that are adjacent to each other. For example, the third device isolation layer 107 may be spaced apart at a second spacing S2 from the gate structures GS disposed at edges of the standard cells SC. In some embodiments, the second spacing S2 may be substantially the same as the first spacing S1. The third device isolation layer 107 may have a second width W2 less than about twice (i.e., double) the first width W1 of the gate structures GS. For example, the second width W2 of the third device isolation layer 107 may be substantially the same as the first width W1 of the gate structures GS.

The third device isolation layer 107 may have an upper portion that protrudes upward beyond the active patterns 101 and penetrates portions of the active patterns 101. The third device isolation layer 107 may have a top surface lower than those of the gate structures GS and higher than those of the active patterns 101. The third device isolation layer 107 may have a bottom surface at a level lower than or substantially the same as that of the bottom surface of the first or second device isolation layer 103 or 105.

Dummy spacers 123 may be disposed on opposite sidewalls of the upper portion of the third device isolation layer 107. In some embodiments, the dummy spacers 123 may include an insulating material the same as that of the gate spacers 121. The dummy spacers 123 may have top surfaces lower than those of the gate spacers 121. For example, the dummy spacers 123 may have a height less than that of the gate spacers 121.

Figure 3A:
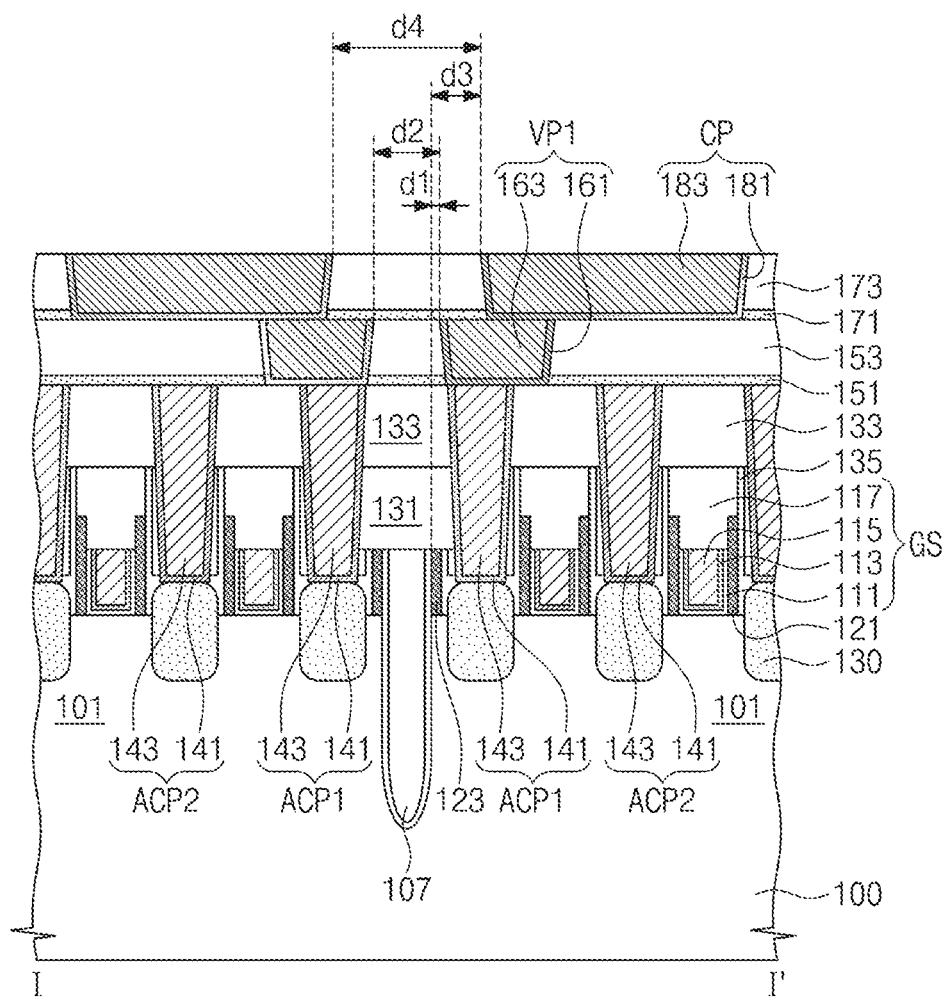
FIGS. 3A, 3B, 3C, and 3D illustrate cross-sectional views respectively taken along lines I-I', II-II', III-III', and IV-IV' of FIG. 2.
Figure 3B:
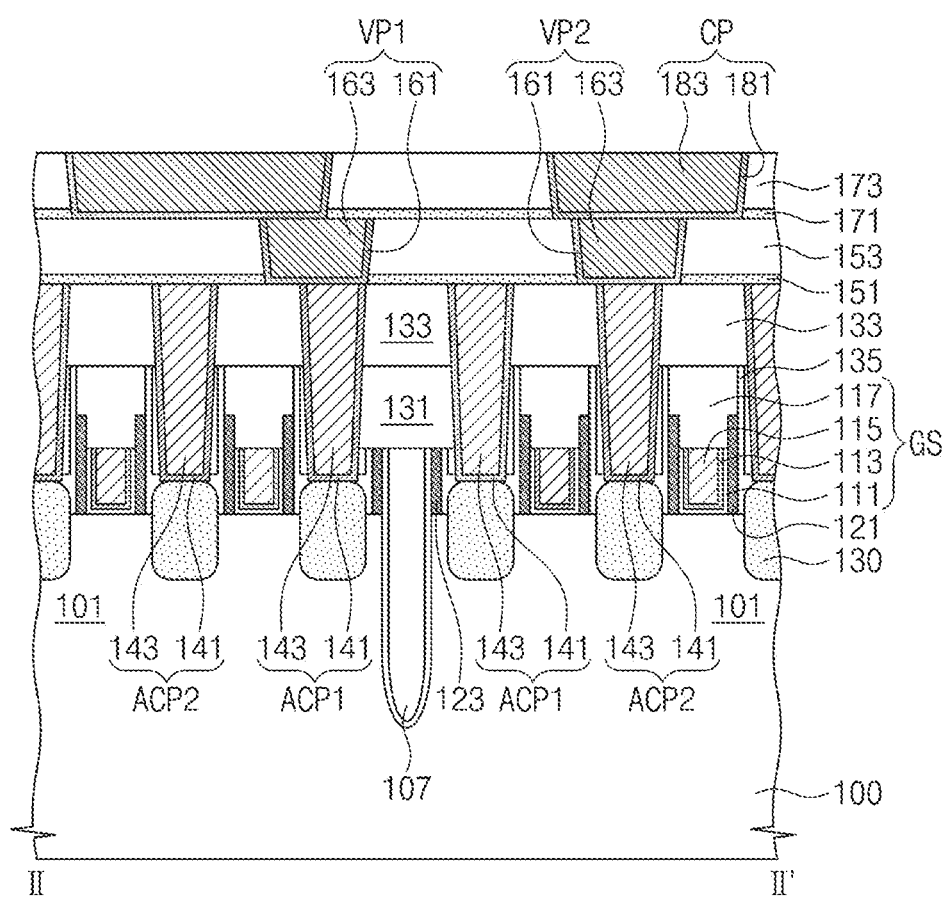
Figure 3C:
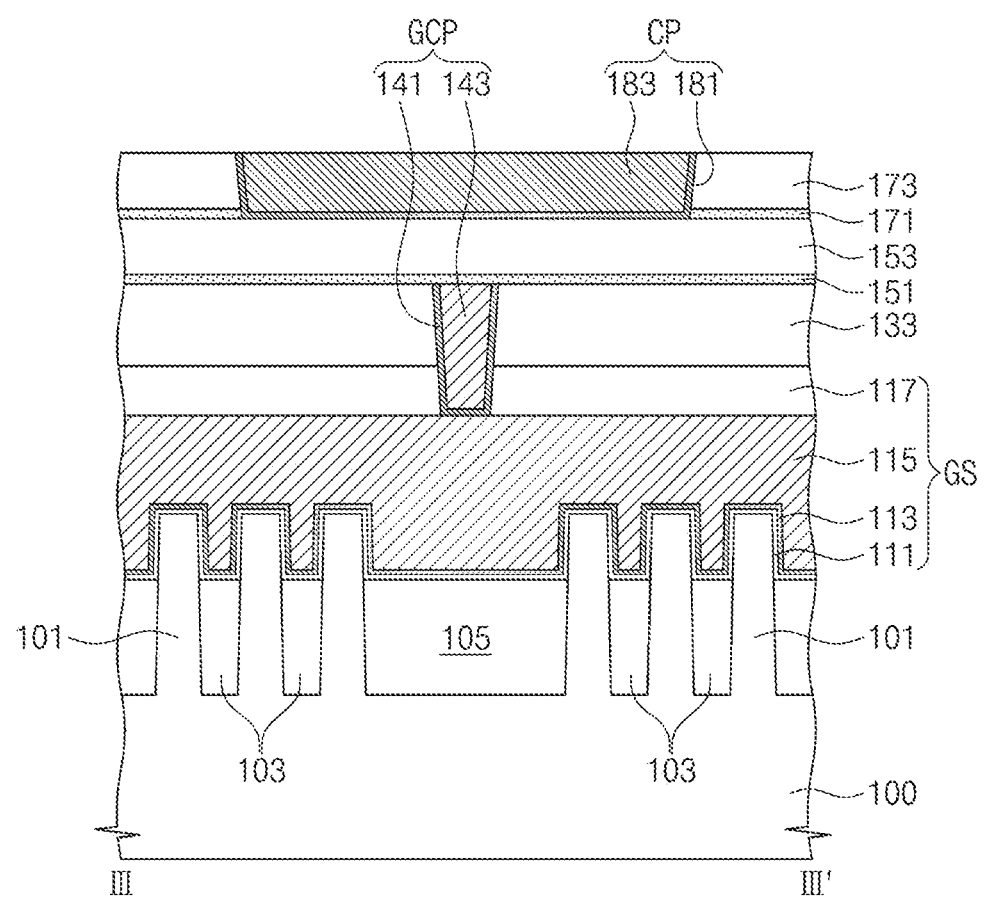
Figure 3D:
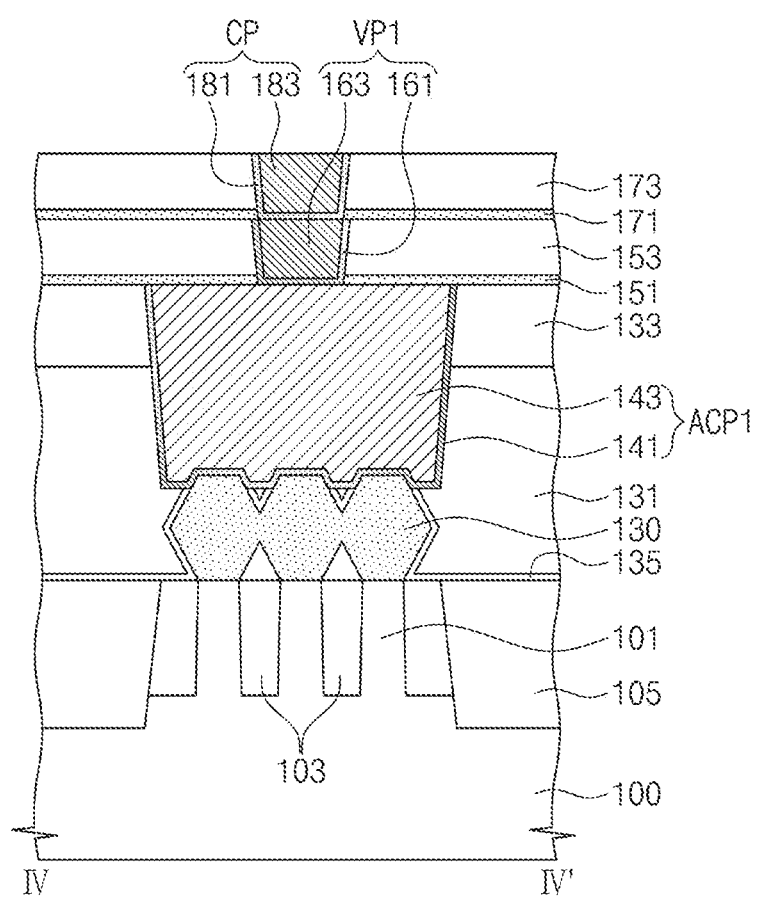

The source/drain impurity layers 130 may be disposed on the active patterns 101 on opposite sides of each of the gate structures GS. The source/drain impurity layers 130 of the first well region R1 may include n-type impurities, and the source/drain impurity layers 130 of the second well region R2 may include p-type impurities. The source/drain impurity layers 130 may be epitaxial layers grown from the active patterns 101. The source/drain impurity layers 130 of the first well region R1 may be germanium (Ge) epitaxial layers, and the source/drain impurity layers 130 of the second well region R2 may be silicon carbide (SiC) epitaxial layers. According to some embodiments, the third device isolation layer 107 may separate, from each other, the source/drain impurity layers 130 that are adjacent to each other in the first direction D1 at edges of the standard cells SC. The source/drain impurity layers 130 formed by epitaxial growth may be connected to each other in the second direction D2, as illustrated in FIG. 3D. As used herein, the term "source/drain impurity region" may refer to one of the source/drain impurity layers 130.

The gap-fill insulation layer 131 may fill a space between the gate structures GS and may cover the source/drain impurity layers 130. In some embodiments, the top surface of the gap-fill insulation layer 131 may be substantially coplanar with the top surfaces of the gate structures GS. The gap-fill insulation layer 131 may cover the top surface of the third device isolation layer 107.

In some embodiments, before the gap-fill insulation layer 131 is formed, an etch stop layer 135 may be formed to have a substantially uniform thickness. The etch stop layer 135 may extend onto the source/drain impurity layers 130 from sidewalls of the gate spacers 121. The etch stop layer 135 may extend onto sidewalls of the capping insulation pattern 117 from the sidewalls of the gate spacers 121.

An interlayer insulation layer 133 may be disposed on the gap-fill insulation layer 131 and may cover the top surfaces of the gate structures GS. The gap-fill insulation layer 131 and the interlayer insulation layer 133 may be formed of an insulating material having an etch selectivity to the gate spacers 121, and may include one or more of a silicon oxide layer, a silicon nitride layer, a silicon oxynitride layer, and a low-k dielectric layer.

The active contact patterns ACP1 and ACP2 may penetrate the interlayer insulation layer 133, the gap-fill insulation layer 131, and the etch stop layer 135, and may be connected to the source/drain impurity layers 130. In some embodiments, the active contact patterns ACP1 and ACP2 may include first active contact patterns ACP1, which lie between the third device isolation layer 107 and its adjacent gate structures GS, and second active contact patterns ACP2, which lie between ones of the gate structures GS that are adjacent to each other.

Each of the active contact patterns ACP1 and ACP2 may be connected either to one source/drain impurity layer 130 or to a plurality of the source/drain impurity layers 130 disposed in the second direction D2. The active contact patterns ACP1 and ACP2 may include a first metallic material, for example, metal (e.g., tungsten, titanium, or tantalum) and/or conductive metal nitride (e.g., titanium nitride, tantalum nitride, or tungsten nitride). Each of the active contact patterns ACP1 and ACP2 may include a first barrier metal layer 141 and a first metal layer 143. The first barrier metal layer 141 of the active contact patterns ACP1 and ACP2 may have a uniform thickness, and may conformally cover a top surface of the source/drain impurity layer 130.

The gate contact patterns GCP may penetrate the interlayer insulation layer 133, the gap-fill insulation layer 131, and the capping insulation patterns 117 of the gate structures GS, and may be connected to the gate metal patterns 115. The gate contact patterns GCP may be formed simultaneously with the active contact patterns ACP1 and ACP2, and may include the same first metallic material as that of the active contact patterns ACP1 and ACP2. Like the active contact patterns ACP1 and ACP2, each of the gate contact patterns GCP may include the first barrier metal layer 141 and the first metal layer 143. The first barrier metal layer 141 of the gate contact patterns GCP may have a uniform thickness, and may be interposed between the first metal layer 143 and the gate metal pattern 115. The gate contact patterns GCP may have top surfaces substantially coplanar with those of the active contact patterns ACP1 and ACP2.

A first etch stop layer 151 and a first interlayer dielectric layer 153 may be sequentially stacked on the interlayer insulation layer 133. The first etch stop layer 151 may cover the top surfaces of the active contact patterns ACP1 and ACP2 and the top surfaces of the gate contact patterns GCP. The first etch stop layer 151 may include, for example, silicon nitride (SiN), silicon oxynitride (SiON), silicon carbide (SiC), silicon carbon nitride (SiCN), or a combination thereof. The first interlayer dielectric layer 153 may include a dielectric material whose dielectric constant is lower than that of a silicon oxide layer.

The via patterns VP1 and VP2 may be formed in the first interlayer dielectric layer 153 and the first etch stop layer 151, and may be connected to the active contact patterns ACP1 and ACP2. The via patterns VP1 and VP2 may include a second metallic material different from the first metallic material, and the second metallic material may have resistivity less than that of the first metallic material. For example, the second metallic material may include copper or its alloy. In this description, the copper alloy may mean copper mixed with an extremely small amount of one of Carbon (C), Silver (Ag), Cobalt (Co), Tantalum (Ta), Indium (In), Tin (Sn), Zinc (Zn), Manganese (Mn), Titanium (Ti), Magnesium (Mg), Chromium (Cr), Germanium (Ge), Strontium (Sr), Platinum (Pt), Aluminum (Al), and Zirconium (Zr). Each of the via patterns VP1 and VP2 may include a second barrier metal layer 161 and a second metal layer 163, and the second barrier metal layer 161 may be interposed between the second metal layer 163 and the active contact pattern ACP1 or ACP2.

According to some embodiments, the via patterns VP1 and VP2 may include first via patterns VP1 connected to the first active contact pattern ACP1 and second via patterns VP2 connected to the second active contact pattern ACP2. For example, the first via pattern VP1 and the first active contact pattern ACP1 may be electrically connected to each other at an edge of each of the standard cells SC, and the second via pattern VP2 and the second active contact pattern ACP2 may be electrically connected to each other at an inner region of each of the standard cells SC.

According to some embodiments, each of the first via patterns VP1 may have a bar shape whose major axis extends in the first direction D1 on the first active contact pattern ACP1. For example, the first via pattern VP1 may have a length in the first direction D1 greater than a width in the first direction D1 of the first active contact pattern ACP1. As viewed in plan, the first via patterns VP1 may overlap a portion of the gate structure GS. The first via pattern VP1 may have one sidewall spaced apart at a first distance d1 in the first direction D1 from an axis aligned with a sidewall of the third device isolation layer 107.

In some embodiments, the first via patterns VP1 of neighboring standard cells SC may be adjacent to each other across the third device isolation layer 107. The first via patterns VP1 may be spaced apart from each other in the first direction D1 at a second distance d2 greater than the second width W2 of the third device isolation layer 107.

A second etch stop layer 171 and a second interlayer dielectric layer 173 may be sequentially stacked on the first interlayer dielectric layer 153. The second etch stop layer 171 and the second interlayer dielectric layer 173 may cover top surfaces of the first and second via patterns VP1 and VP2. For example, the second etch stop layer 171 and the second interlayer dielectric layer 173 may be formed after the first and second via patterns VP1 and VP2 are formed.

At/in each of the standard cells SC, the wiring patterns CP may be disposed in the second etch stop layer 171 and the second interlayer dielectric layer 173, and may be connected to the first and second via patterns VP1 and VP2. The wiring patterns CP may include a third metallic material whose resistivity is less than that of the first metallic material. In some embodiments, the third metallic material may be the same as the second metallic material, and may include, for example, copper or its alloy. The wiring patterns CP may include a third barrier metal layer 181 and a third metal layer 183. The third barrier metal layer 181 may be interposed between the third metal layer 183 of the wiring pattern CP and the second metal layer 163 of the first or second via pattern VP1 or VP2. In this configuration, an interface may exist between the wiring patterns CP and the via patterns VP1 and VP2.

In some embodiments, the wiring pattern CP may connect one first via pattern VP1 to another first via pattern VP1 spaced apart from the one first via pattern VP1, or may connect the first via pattern VP1 to the second via pattern VP2. Each of the wiring patterns CP may extend in the first direction D1, and may include a first segment connected to the first active contact pattern ACP1. Each of the wiring patterns CP may further include a second segment that extends in the second direction D2 from the first segment.

In some embodiments, the first segment of the wiring pattern CP may run across the gate structure GS. The wiring pattern CP may have one sidewall spaced apart from an axis that is aligned with a sidewall of the third device isolation layer 107 in the first direction D1 at a third distance d3 greater than the first distance d1. For example, the one sidewall of the wiring pattern CP may be spaced farther apart from the axis that is aligned with the third device isolation layer 107 than is the one sidewall of the first via pattern VP1. The one sidewall of the first via pattern VP1 may be spaced apart in the first direction D1 from an axis aligned with the one sidewall of the wiring pattern CP. The wiring pattern CP may be in contact with a portion of the first via pattern VP1, and with an entire top surface of the second via pattern VP2. For example, the portion of the first via pattern VP1 that the wiring pattern CP contacts may be only a first portion of the first via pattern VP1, such that a second portion of the first via pattern VP1 is free of the wiring pattern CP.

The wiring patterns CP of the standard cells SC may be spaced apart from each other across the third device isolation layer 107 in the first direction D1 at a fourth distance d4. The fourth distance d4 may be greater than the second distance d2. Namely, the fourth distance d4 between the wiring patterns CP adjacent to each other in the first direction D1 may be greater than the second distance d2 between the first via patterns VP1 adjacent to each other in the first direction D1.

The first power line PL1 and the second power line PL2 may extend in the first direction D1, and may be connected in common to the standard cells SC. The first power line PL1 may be spaced apart in the second direction D2 from the second power line PL2. The first and second power lines PL1 and PL2 may each be electrically connected through the via patterns VP1 and VP2 to at least a corresponding one of the active contact patterns ACP1 and ACP2.

According to some embodiments, even if the gate structures GS decrease in pitch and the third device isolation layer 107 decreases in width, a process margin may be secured to the wiring patterns CP adjacent to each other in the first direction D1. In addition, as the first via patterns VP1 have a bar shape whose major axis extends in the first direction D1, a contact area may be securely provided between the wiring pattern CP and the first via pattern VP1.

Figure 4:
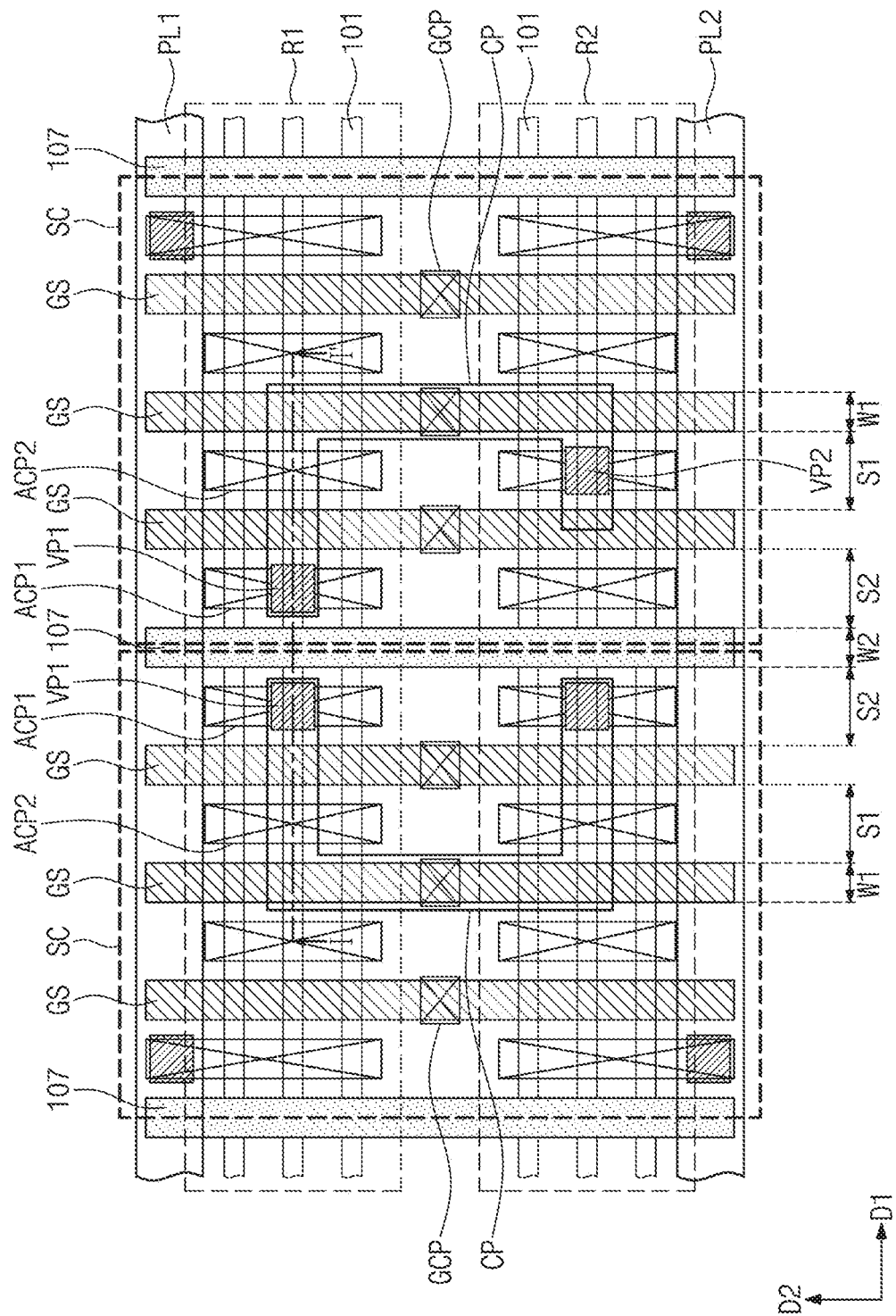
FIG. 4 illustrates a plan view showing a semiconductor device according to example embodiments of the inventive concepts.
Figure 5:
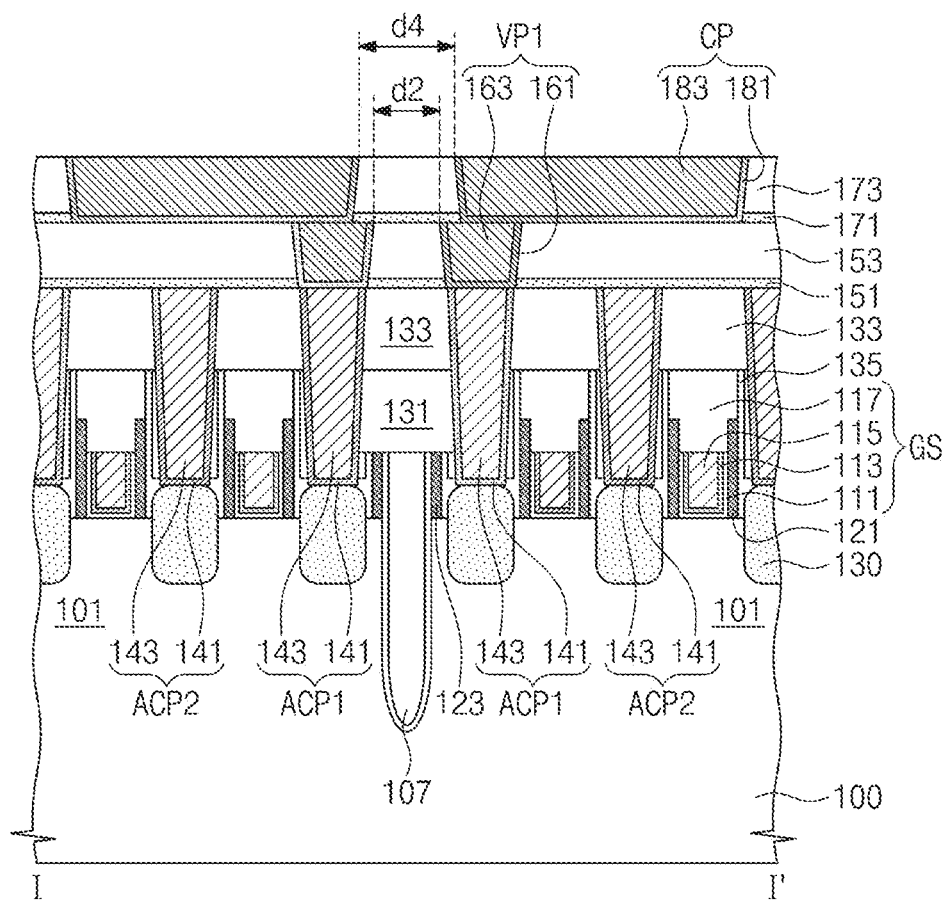
FIG. 5 illustrates a cross-sectional view taken along line I-I' of FIG. 4.
Figure 6:
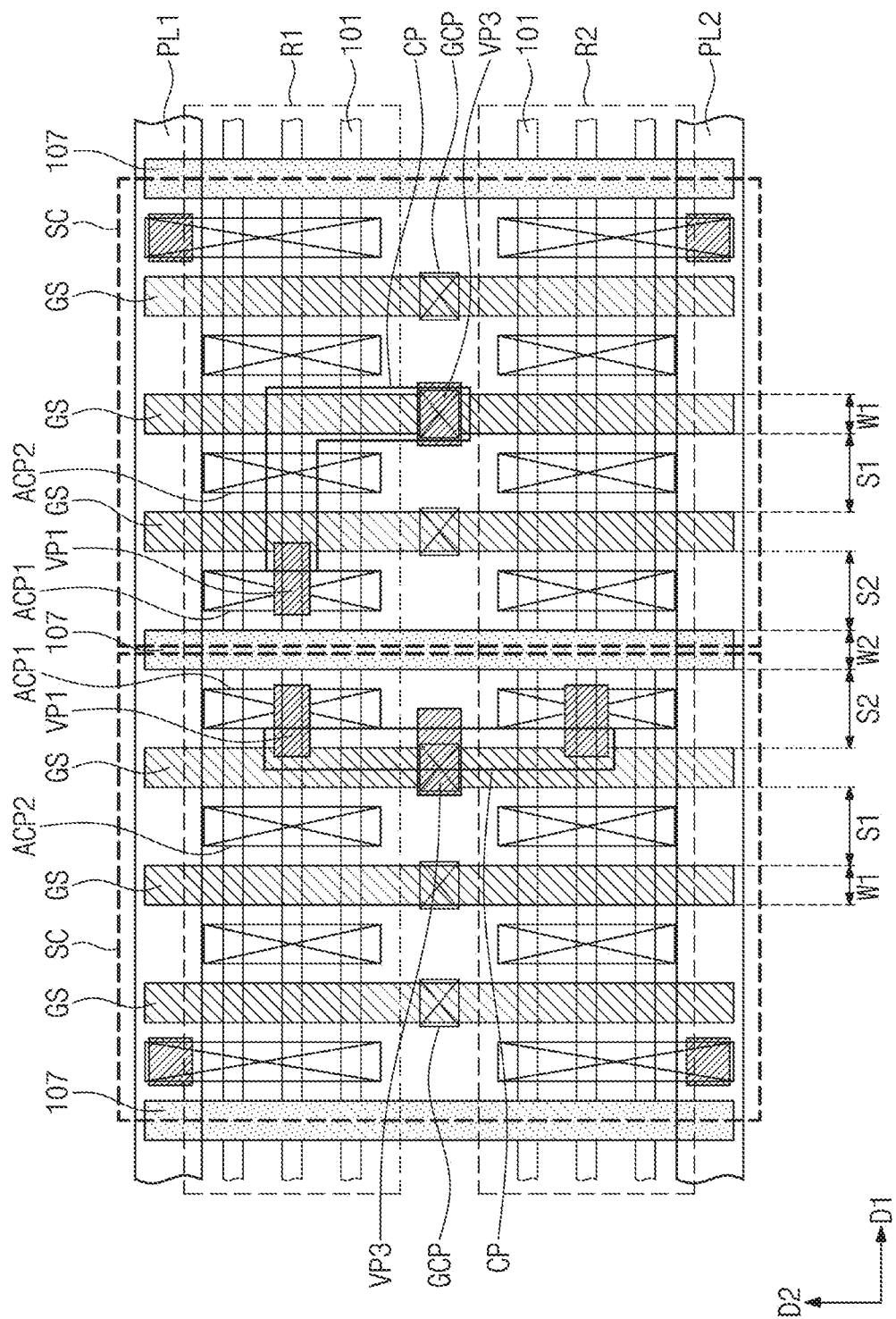
FIG. 6 illustrates a plan view showing a semiconductor device according to example embodiments of the inventive concepts.

FIG. 4 illustrates a plan view showing a semiconductor device according to example embodiments of the inventive concepts. FIG. 5 illustrates a cross-sectional view taken along line I-I' of FIG. 4. FIG. 6 illustrates a plan view showing a semiconductor device according to example embodiments of the inventive concepts. Descriptions of the same technical features as those of the embodiments discussed with reference to FIGS. 2 and 3A to 3D may be omitted in the interest of brevity of description.

Referring to FIGS. 4 and 5, the first active contact patterns ACP1 adjacent to the third device isolation layer 107 may not overlap the gate structures GS, in plan view. For example, the first via pattern VP1 may be disposed between the third device isolation layer 107 and its adjacent gate structure GS. The first via pattern VP1 may have a width in the first direction D1 less than a spacing S2 between the third device isolation layer 107 and its adjacent gate structure GS.

Referring to FIG. 6, a semiconductor device may be provided with via patterns that include a first via pattern VP1 connected to the first active contact pattern ACP1, a second via pattern VP2 connected to the second active contact pattern ACP2, and a third via pattern VP3 connected to the gate contact pattern GCP. The first to third via patterns VP1, VP2, and VP3 may each have a bar shape whose major axis extends in the first direction D1.

In some embodiments, one of the wiring patterns CP may extend parallel to the third device isolation layer 107 in the second direction D2, and may be electrically connected through the first via patterns VP1 to the first active contact patterns ACP1.

Alternatively, the wiring pattern CP may connect the first via pattern VP1 adjacent to the third device isolation layer 107 to the third via pattern VP3 connected to the gate structure GS. The wiring pattern CP may have one sidewall, which may be spaced farther apart from the third device isolation layer 107 than one sidewall of the first via pattern VP1 and which may be in contact with a portion of the first via pattern VP1.

Figure 7:
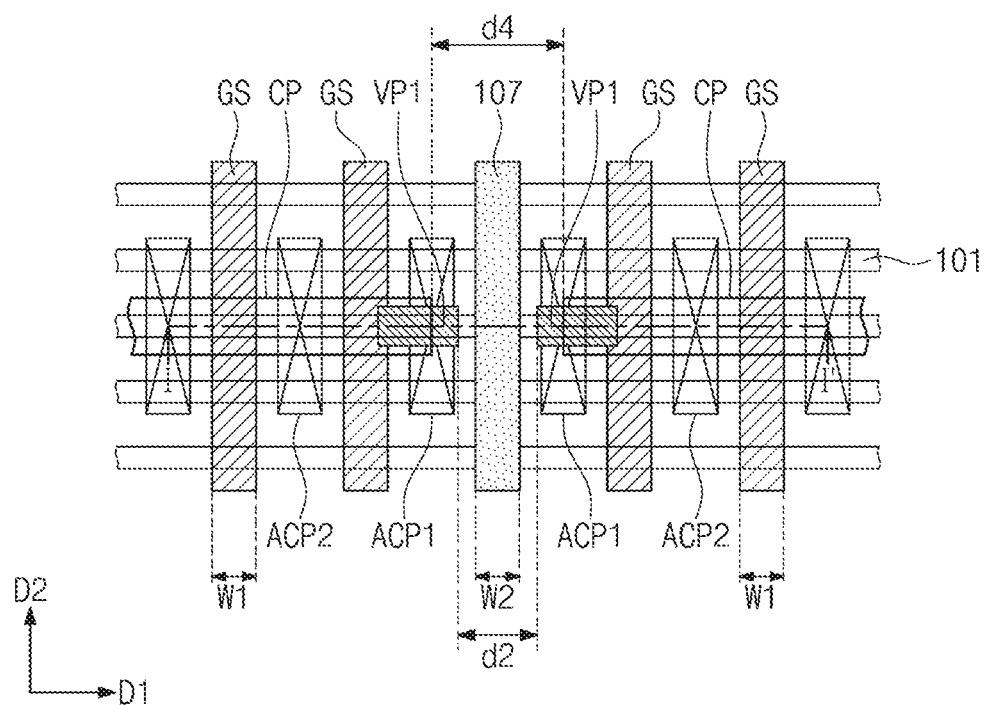
FIGS. 7, 9, and 11 illustrate plan views showing a portion of a semiconductor device according to example embodiments of the inventive concepts.
Figure 8:
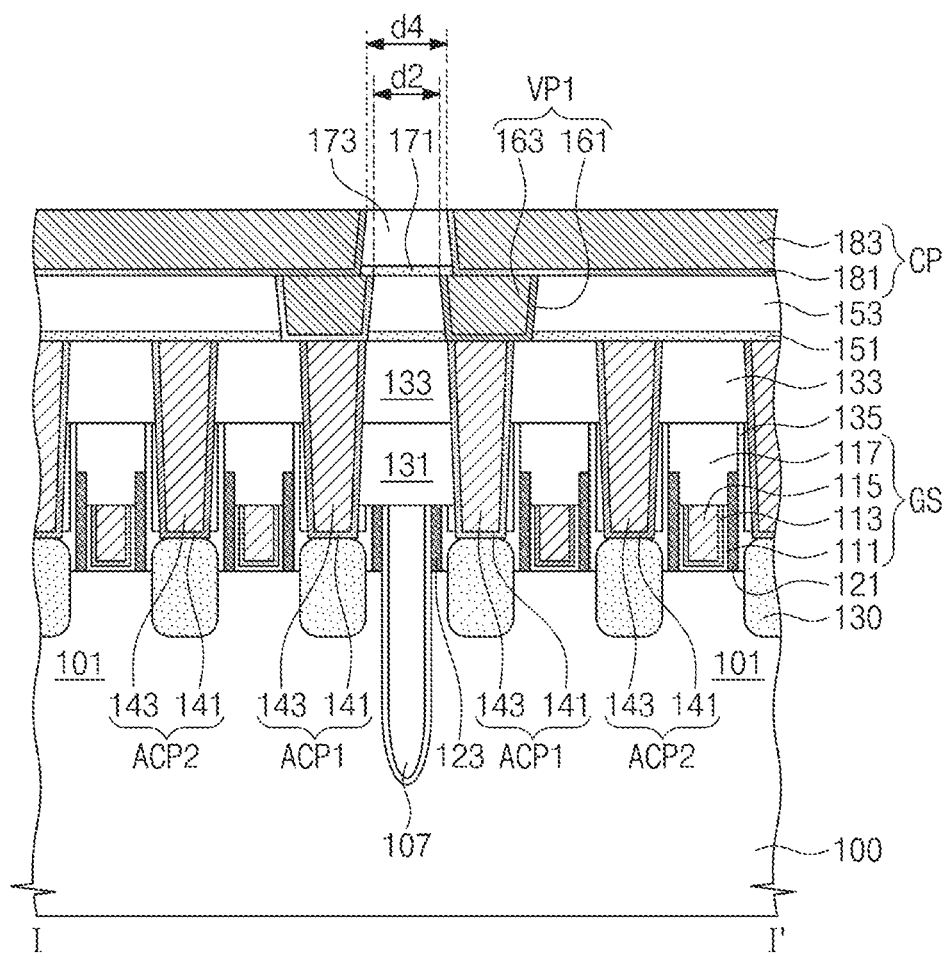
FIGS. 8, 10, and 12 illustrate cross-sectional views taken along line I-I' of FIGS. 7, 9, and 11, respectively.
Figure 9:
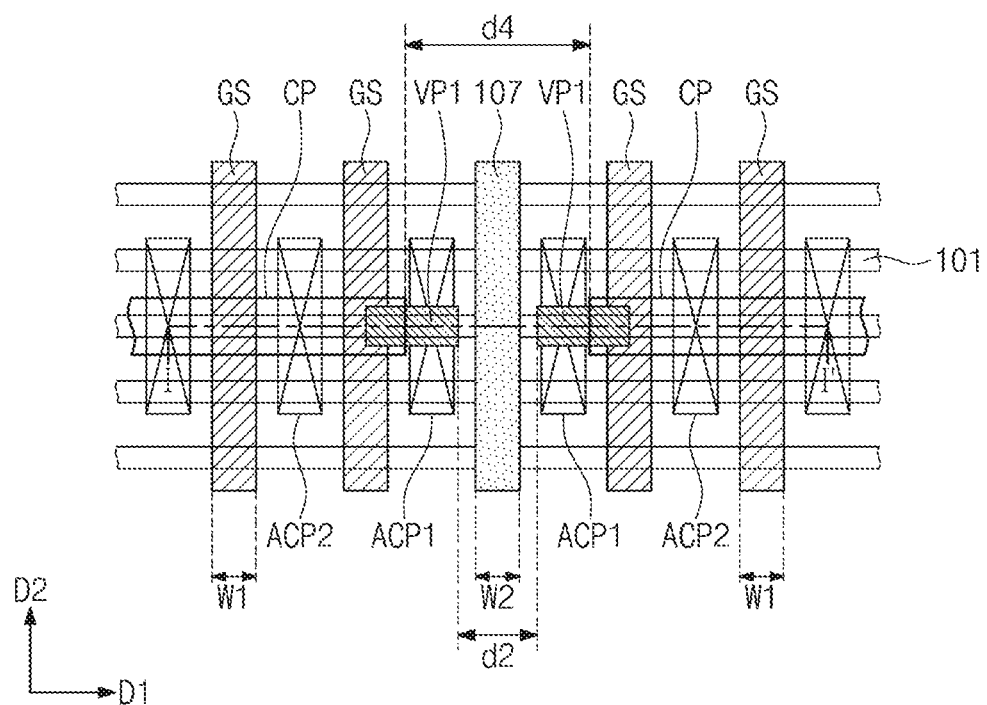
Figure 10:
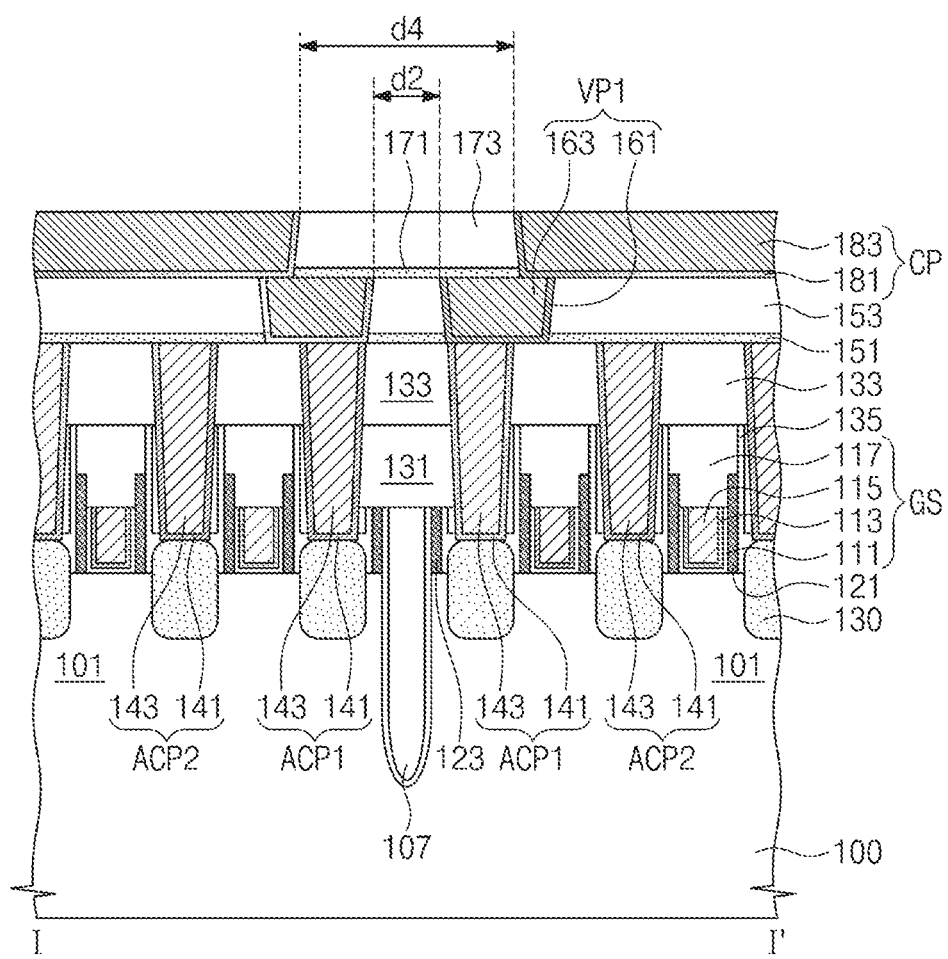
Figure 11:
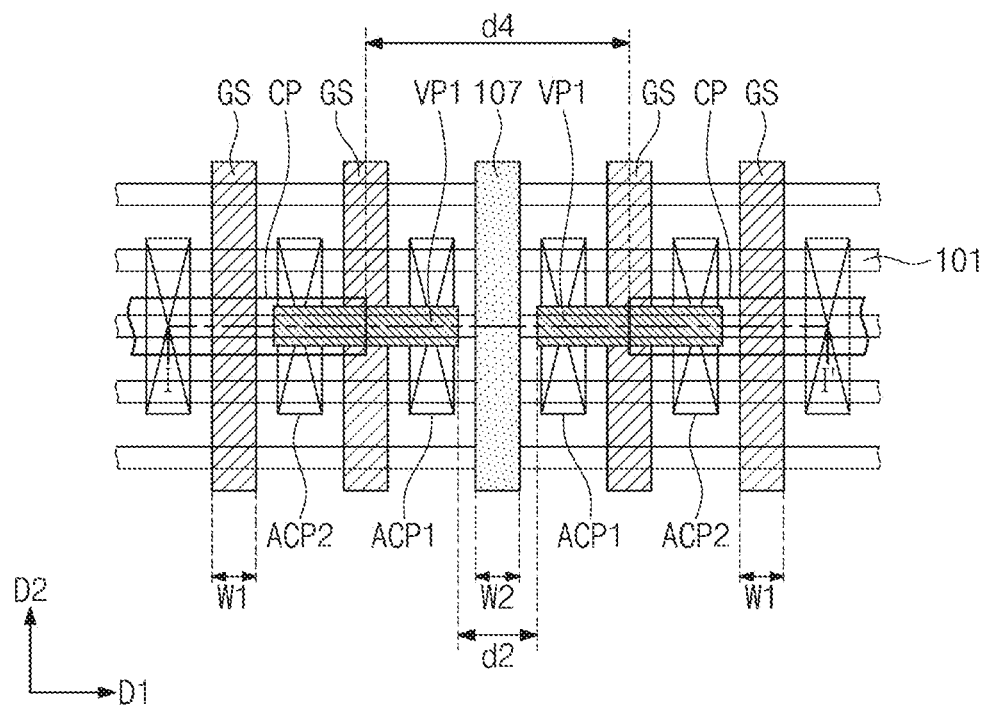
Figure 12:
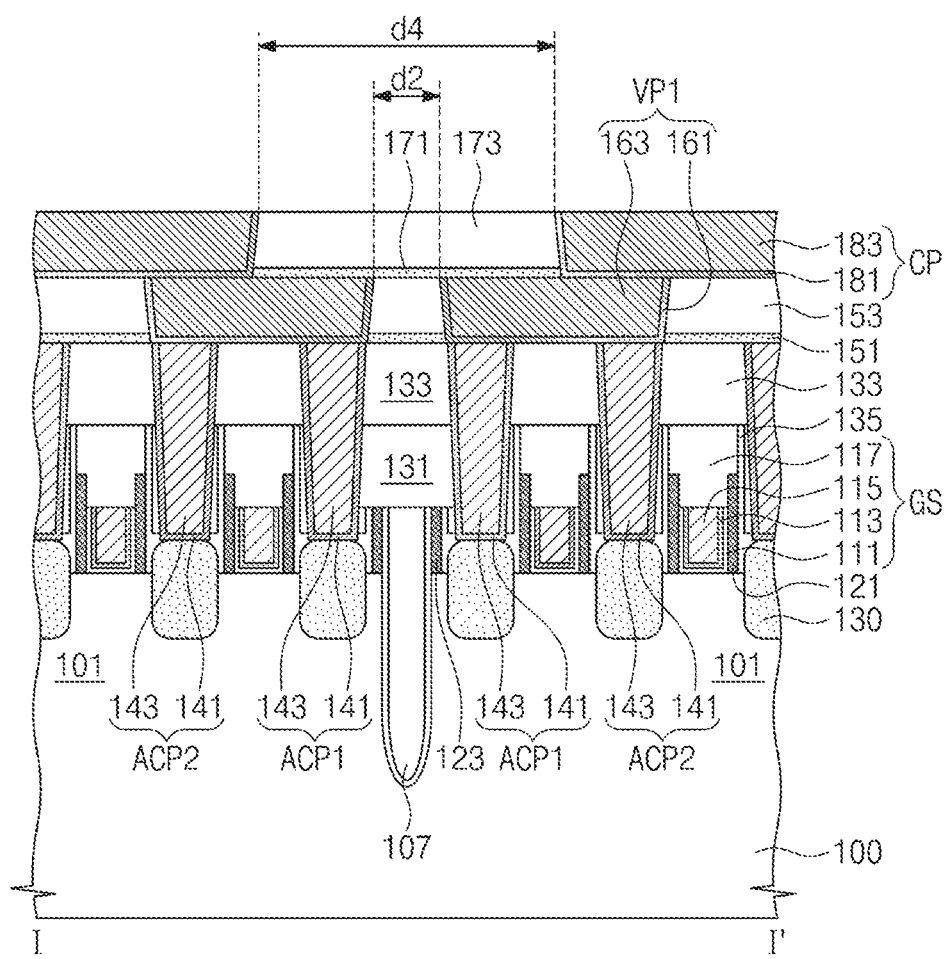

FIGS. 7, 9, and 11 illustrate plan views showing a portion of a semiconductor device according to example embodiments of the inventive concepts. FIGS. 8, 10, and 12 illustrate cross-sectional views taken along line I-I' of FIGS. 7, 9, and 11, respectively. Descriptions of the same technical features as those of the embodiments discussed with reference to FIGS. 2 and 3A to 3D may be omitted in the interest of brevity of description.

Referring to FIGS. 7 and 8, first and second ones of (i.e., a pair of) the first via patterns VP1 adjacent to each other across the third device isolation layer 107 may be spaced apart from each other at a second distance d2, and the wiring patterns CP adjacent to each other across the third device isolation layer 107 may be spaced apart from each other at a fourth distance d4. The fourth distance d4 may be substantially equal to or greater than the second distance d2.

Referring to FIGS. 9 and 10, the first via patterns VP1 may be spaced apart from each other in the first direction D1 at a second distance d2, and the wiring patterns CP may be spaced apart from each other at a fourth distance d4 greater than the second distance d2. In addition, each of the first via patterns VP1 may extend in the first direction D1 and may overlap a portion of the gate structure GS.

As viewed in plan view, each of the wiring patterns CP may be in contact with a portion of the first via pattern VP1, and may not overlap the first active contact pattern ACP1. Because an increased spacing is provided between the wiring patterns CP as well as contact areas are secured between the wiring patterns CP and the first via patterns VP1, even if the standard cells SC decrease in area, a process margin may be secured to the wiring patterns CP.

Referring to FIGS. 11 and 12, each of the first via patterns VP1 may run across at least one gate structure GS, and may extend onto the second active contact pattern ACP2 from the first active contact pattern ACP1. In this configuration, each of the first via patterns VP1 may electrically connect the first active contact pattern ACP1 to the second active contact pattern ACP2.

Figure 13:
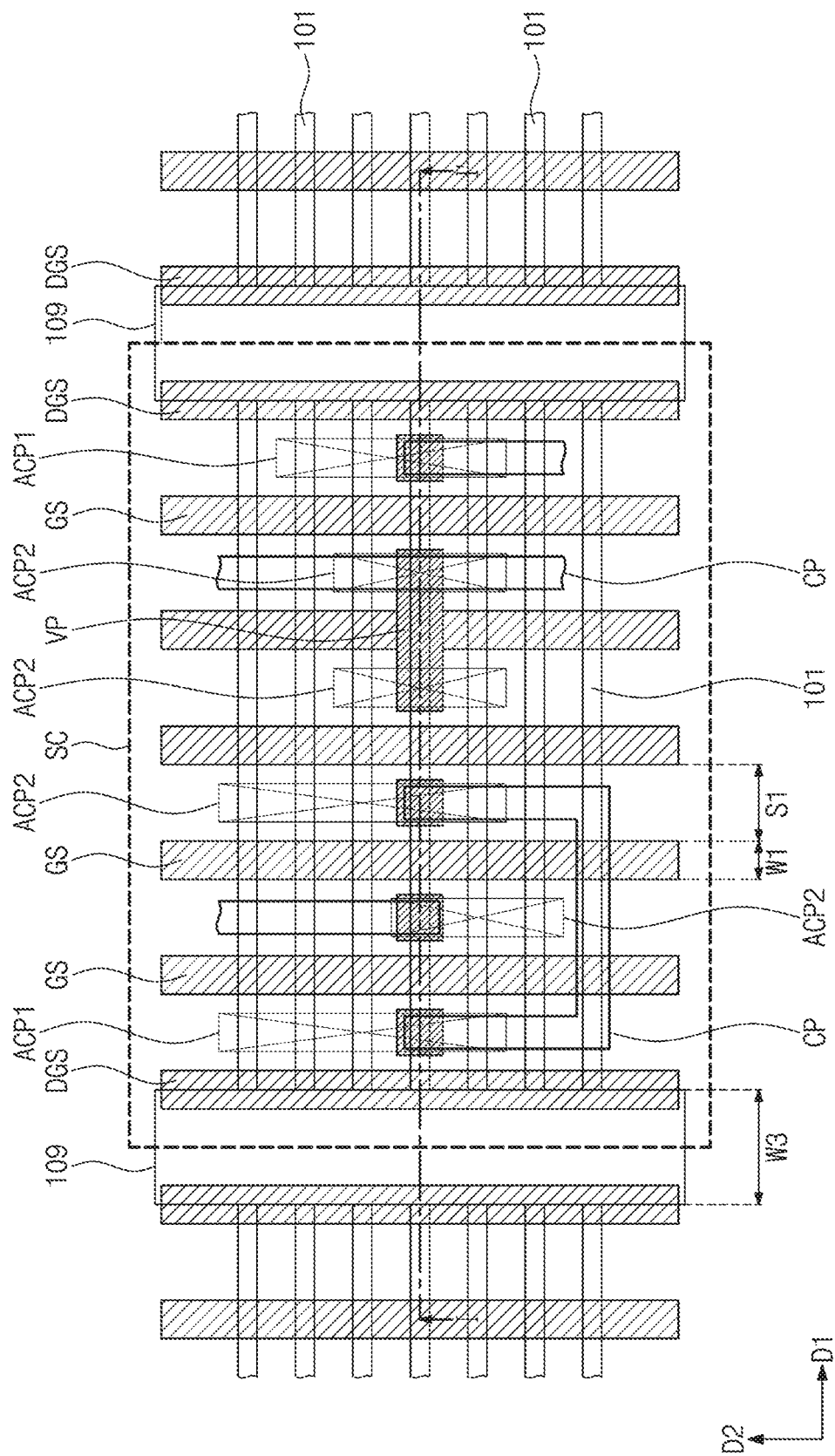
FIG. 13 illustrates a plan view showing a semiconductor device according to example embodiments of the inventive concepts.
Figure 14:
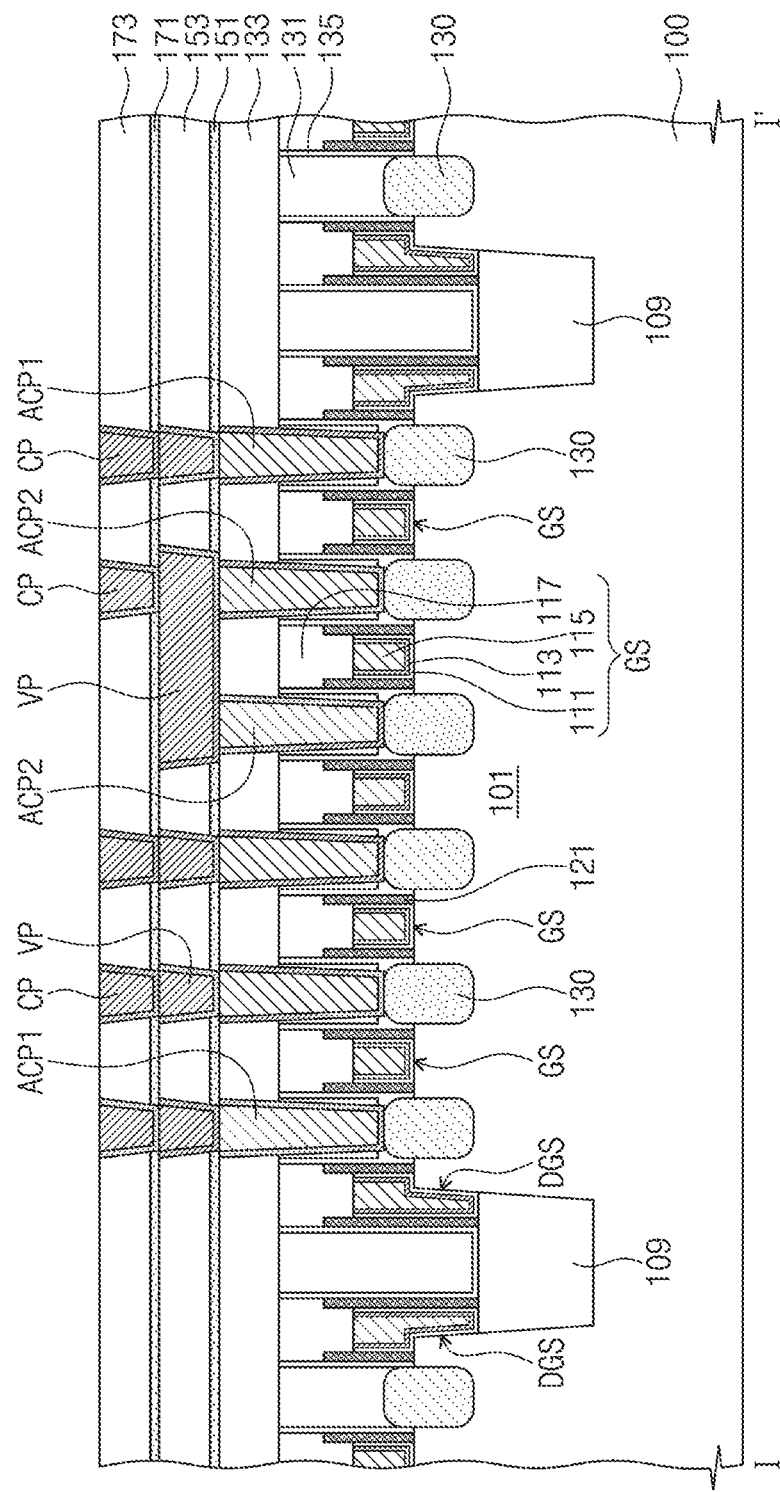
FIG. 14 illustrates a cross-sectional view taken along line I-I' of FIG. 13.

FIG. 13 illustrates a plan view showing a semiconductor device according to example embodiments of the inventive concepts. FIG. 14 illustrates a cross-sectional view taken along line I-I' of FIG. 13. Descriptions of the same technical features as those of the embodiments discussed with reference to FIGS. 2 and 3A to 3D may be omitted in the interest of brevity of description.

Referring to FIGS. 13 and 14, the gate structures GS may extend in the second direction D2, while crossing the active patterns 101 that extend in the first direction D1. The gate structures GS may have substantially the same first width W1, and may be equally spaced apart from each other in the first direction D1 at a first spacing S1.

A fourth device isolation layer 109 may separate the active patterns 101 from each other in the first direction D1 at an edge of the standard cell SC. In some embodiments, the fourth device isolation layer 109 may have a width W3 greater than the first spacing S1 between neighboring gate structures GS.

Dummy gate structures DGS may be disposed at the edge of the standard cell SC and at a boundary between the fourth device isolation layer 109 and the active patterns 101. The dummy gate structures DGS may have a stack structure the same as that of the gate structures GS.

The active contact patterns ACP1 and ACP2 may be connected to the source/drain impurity layers 130 on opposite sides of each of the gate structures GS. As discussed above, the active contact patterns ACP1 and ACP2 may include first active contact patterns ACP1, which lie between the fourth device isolation layer 109 and its adjacent gate structures GS, and second active contact patterns ACP2, which lie between ones of the gate structures GS that are adjacent to each other.

In some embodiments, the via patterns VP may be connected to the active contact patterns ACP1 and ACP2, and one of the via patterns VP may electrically connect a plurality of (e.g., a pair of) the second active contact patterns ACP2 to each other. The one of the via patterns VP may extend in the first direction D1 to run across the gate structure GS, and may be in direct contact with the plurality of second active contact patterns ACP2.

As discussed above, the active contact patterns ACP1 and ACP2 may include a first metallic material, and the via patterns VP may include a second metallic material whose resistivity is less than that of the first metallic material.

According to example embodiments of the inventive concepts, compared to the via patterns, the wiring patterns may be spaced farther apart in the first direction from the device isolation layer at a boundary between the standard cells. Accordingly, even if a spacing between the standard cells is decreased due to a width reduction of the device isolation layer, a process margin is secured to the wiring patterns. The via pattern may have a bar shape whose major axis extends in the first direction, such that a contact area may be securely provided between the wiring pattern and the via pattern.

The via pattern and the wiring pattern that are connected to the standard cell may be formed of a metallic material having a lower resistivity, thereby decreasing resistance between connection lines connected to the standard cell.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a plurality of active patterns extending in a first direction;
a device isolation layer crossing the plurality of active patterns and extending in a second direction crossing the first direction;
a gate structure spaced apart from the device isolation layer and extending in the second direction to cross the plurality of active patterns;
a plurality of source/drain impurity layers adjacent opposite sides of the gate structure;
a contact pattern connected to one of the plurality of source/drain impurity layers that is between the device isolation layer and the gate structure;
a connection pattern connected to the contact pattern, the connection pattern including a first barrier metal layer and a first metal layer; and
a wiring pattern connected to the connection pattern, the wiring pattern including a second barrier metal layer and a second metal layer,
wherein the second barrier metal layer is between a top surface of the first metal layer and a bottom surface of the second metal layer.

2. The semiconductor device of claim 1,
wherein the connection pattern has a first sidewall spaced apart by a first distance in the first direction from the device isolation layer; and
wherein the wiring pattern has a second sidewall spaced apart in the first direction from the device isolation layer by a second distance that is greater than the first distance.

3. The semiconductor device of claim 1,
wherein the gate structure is spaced apart from the device isolation layer in the first direction by a spacing distance, and
wherein the connection pattern has a width less than the spacing distance, in the first direction.

4. The semiconductor device of claim 1, wherein the connection pattern has a length less than a length of the contact pattern, in the second direction.

5. The semiconductor device of claim 1, wherein the wiring pattern extends along the first direction to cross the gate structure.

6. The semiconductor device of claim 1, wherein the connection pattern and the wiring pattern comprise the same metallic material.

7. The semiconductor device of claim 1,
wherein the contact pattern comprises a first metallic material, and
wherein the connection pattern and the wiring pattern comprise a second metallic material comprising a resistivity that is lower than a resistivity of the first metallic material.

8. The semiconductor device of claim 1, wherein the device isolation layer has a width that is substantially equal to a width of the gate structure.

9. The semiconductor device of claim 1, wherein the device isolation layer has a width in the first direction that is shorter than a distance in the first direction between the device isolation layer and the gate structure adjacent the device isolation layer.

10. The semiconductor device of claim 1,
wherein the first metal layer has a first sidewall adjacent to the device isolation layer and the second metal layer has a second sidewall adjacent to the device isolation layer,
wherein the first barrier metal layer includes a first sidewall portion covering the first sidewall of the first metal layer and the second barrier metal layer includes a second sidewall portion covering the second sidewall of the second metal layer, and
wherein the second sidewall portion of the second barrier metal layer is laterally spaced apart from the first sidewall portion of the first barrier metal layer.

11. The semiconductor device of claim 10, further comprising an insulating layer on the connection pattern and covering a top surface of the first sidewall portion of the first barrier metal layer.

12. A semiconductor device comprising:
a substrate comprising a plurality of active patterns extending in a first direction;
a device isolation layer crossing the plurality of active patterns and extending in a second direction crossing the first direction;
a gate structure spaced apart from the device isolation layer and extending in the second direction to cross the plurality of active patterns;
first and second impurity layers on the substrate adjacent opposite first and second sides, respectively, of the gate structure, wherein the first impurity layer is between the device isolation layer and the gate structure;
a first contact pattern connected to the first impurity layer that is between the device isolation layer and the gate structure;
a second contact pattern connected to the second impurity layer;
a connection pattern connected to the first contact pattern; and
a wiring pattern connected to the connection pattern and overlapping both the first and second contact patterns.

13. The semiconductor device of claim 12, wherein a width of the connection pattern is greater than a width of the first contact pattern, in the first direction.

14. The semiconductor device of claim 12,
wherein the connection pattern has a first sidewall spaced apart by a first distance in the first direction from the device isolation layer; and
wherein the wiring pattern has a second sidewall spaced apart in the first direction from the device isolation layer by a second distance that is greater than the first distance.

15. The semiconductor device of claim 12,
wherein the first and second contact patterns comprise a first metallic material,
wherein the connection pattern and the wiring pattern comprise a second metallic material different from the first metallic material.

16. The semiconductor device of claim 12, wherein the connection pattern has a width less than a distance between the device isolation layer and the gate structure adjacent to the device isolation layer.

17. The semiconductor device of claim 12, wherein the wiring pattern extends in the first direction and contacts a portion of a top surface of the connection pattern.

18. The semiconductor device of claim 12, wherein the gate structure includes:
a gate dielectric layer;
a gate barrier metal pattern on the gate dielectric layer;
a gate metal pattern on the gate barrier metal pattern; and a capping insulation pattern on the gate metal pattern,
wherein a top surface of the device isolation layer is located at substantially the same level as a top surface of the gate metal pattern.

19. The semiconductor device of claim 12,
wherein the connection pattern comprises:
 a first barrier metal layer; and
 a first metal layer on the first barrier metal layer, and
wherein the wiring pattern comprises:
 a second barrier metal layer that contacts a top surface of the first metal layer; and
 a second metal layer on the second barrier metal layer.

20. The semiconductor device of claim 19, wherein the first metal layer and the second metal layer comprise the same metallic material.

* * * * *